US007285898B2

(12) United States Patent
Sawada

(10) Patent No.: US 7,285,898 B2
(45) Date of Patent: Oct. 23, 2007

(54) ULTRASONIC TRANSDUCER AND MANUFACTURING METHOD THEREOF

(75) Inventor: Yukihiko Sawada, Tokorozawa (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/242,481

(22) Filed: Oct. 3, 2005

(65) Prior Publication Data

US 2006/0066184 A1 Mar. 30, 2006

Related U.S. Application Data

(63) Continuation of application No. PCT/JP2004/004773, filed on Apr. 1, 2004.

(30) Foreign Application Priority Data

Apr. 1, 2003 (JP) ............................ 2003-098213
Apr. 1, 2003 (JP) ............................ 2003-098214
Apr. 1, 2003 (JP) ............................ 2003-098215

(51) Int. Cl.
*H01L 41/08* (2006.01)

(52) U.S. Cl. ...................................... 310/334; 310/335

(58) Field of Classification Search ........ 310/334–337, 310/327
See application file for complete search history.

(56) References Cited

U.S. PATENT DOCUMENTS

| | | | | |
|---|---|---|---|---|
| 3,827,115 | A * | 8/1974 | Bom | 29/25.35 |
| 4,281,550 | A * | 8/1981 | Erikson | 73/626 |
| 4,992,692 | A * | 2/1991 | Dias | 310/335 |
| 5,103,129 | A * | 4/1992 | Slayton et al. | 310/335 |
| 5,229,980 | A * | 7/1993 | Pawela | 367/157 |
| 5,810,009 | A | 9/1998 | Mine et al. | |
| 6,049,958 | A * | 4/2000 | Eberle et al. | 29/25.35 |
| 6,123,673 | A | 9/2000 | Eberle et al. | |

FOREIGN PATENT DOCUMENTS

| | | |
|---|---|---|
| JP | 2-271839 | 11/1990 |
| JP | 2-271843 | 11/1990 |
| JP | 6-121389 | 4/1994 |
| JP | 2502685 | 3/1996 |
| JP | 8-89505 | 4/1996 |
| JP | 2729442 | 12/1997 |
| JP | 10-308997 | 11/1998 |
| JP | 11-501245 | 2/1999 |
| JP | 2000-115892 | 4/2000 |
| JP | 2002-336258 | 11/2002 |
| WO | WO 97/23865 | 7/1997 |

* cited by examiner

*Primary Examiner*—Mark Budd
(74) *Attorney, Agent, or Firm*—Scully, Scott, Murphy & Presser, P.C.

(57) ABSTRACT

An ultrasonic transducer comprises: an acoustic matching layer including at least a layer made up of a hard material; a piezoelectric member of which the length dimension is shorter than this acoustic matching layer, which is fixed and disposed at a predetermined position of a layer made up of the hard material which makes up the acoustic matching layer, and divided into a plurality of piezoelectric devices in this disposed state; and a transducer shape-formative member made up of a hard material, wherein, in a state in which the surfaces of the piezoelectric devices divided and formed are disposed on the inner circumferential surface side, the plurality of piezoelectric devices are arrayed in a predetermined shape, fixed and disposed on the surface where the piezoelectric devices of the acoustic matching layer protruding from the piezoelectric devices have been disposed.

15 Claims, 11 Drawing Sheets

ULTRASONIC TRANSDUCER AND MANUFACTURING METHOD THEREOF

CROSS REFERENCE TO RELATED APPLICATION

This application is a continuation application of PCT/JP2004/004773 filed on Apr. 1, 2004 and claims the benefit of Japanese Applications No. 2003-098213 filed in Japan on Apr. 1, 2003, No. 2003-098214 filed in Japan on Apr. 1, 2003 and No. 2003-098215 filed in Japan on Apr. 1, 2003, the entire contents of each of which are incorporated herein by their reference.

BACKGROUND OF THE INVENTION

1. Field of the Invention

The present invention relates to an ultrasonic transducer employed for an ultrasonic diagnostic apparatus and the like.

2. Description of the Related Art

In the medical field, various types of ultrasonic diagnostic apparatuses have been proposed in conventional art wherein information regarding living body tissue is obtained by transmitting an ultrasonic wave toward the living body tissue from an ultrasonic transducer, and also receiving a reflected wave reflected by the living body tissue with the same ultrasonic transducer as the ultrasonic transducer which transmitted the ultrasonic wave, or another ultrasonic transducer provided in another member to perform signal processing for making an image.

Examples of ultrasonic transducers employed for such an ultrasonic diagnostic apparatus include an ultrasonic transducer employing the electronic scanning method wherein a plurality of piezoelectric devices are arrayed regularly, and driven sequentially. Examples of such an ultrasonic transducer include a radial-array type wherein a plurality of piezoelectric devices are arrayed in a cylindrical shape, a convex-array type arrayed in a generally partially cylindrical shape, and a linear-array type arrayed in a flat plate shape.

Of these, the radial-array ultrasonic transducer is applied to the ultrasonic probe disclosed in Japanese Unexamined Patent Application Publication No. 2-271839, for example. With this ultrasonic transducer, a transducer unit is formed by sequentially bonding piezoelectric device plates and acoustic-matching layers of which materials are lead zirconate titanate, or the like to a supporting member made up of a thin plate having flexibility with damper effects. Subsequently, a transducer array having a plurality of ultrasonic transducers are configured by forming grooves in a predetermined pitch orthogonal to one side in the longitudinal direction using cutting means while excluding lower supporting members, and the backsides of the supporting members making up this transducer array are bonded and formed around a damper member (backing member described in the specification of the present application) also serving as a circular fixing member.

Also, with Japanese Patent No. 2502685, the method for manufacturing an ultrasonic probe has been disclosed wherein a first acoustic matching layer, and a backside load member made up of a deformable member or the like, on both sides of a piezoelectric device is provided, grooves reaching part of the backside load member from the first acoustic matching layer side are formed in a predetermined interval using cutting means, and the backside load member is bonded and fixed on the outer side of a curved member formed with a desired curvature.

Also, an example of the above array ultrasonic transducer has been disclosed in Japanese Unexamined Patent Application Publication No. 10-308997. This ultrasonic transducer is formed by forming a recessed portion made up of a groove or a notch on at least any one of the first side and the second side of a piezoelectric member having electrodes, and engaging a conductive member with this recessed portion, and also electrically connecting this conductive member to the electrode near the recessed portion.

Also, with Japanese Patent No. 2729442, the ultrasonic probe has been disclosed wherein the ultrasonic probe comprises an ultrasonic transducer, a ground electrode provided on the front surface side of this ultrasonic transducer, a positive electrode provided on the back surface side of the ultrasonic transducer, an acoustic matching layer bonded on the ground electrode surface side of the ultrasonic transducer, and a conductive member for forming a superimposed structure by superimposing the acoustic matching layer and a backside load member provided on the positive electrode side of the ultrasonic transducer, also exposing the ground electrode by cutting and removing part of the side edge portion of one-side of this superimposed structure from the acoustic matching layer on the front surface side to the backside load member on the back surface side, and electrically connecting the cut surface of the backside load member and the edge surface of the ground electrode by firmly fixing the conductive member, which is connected to the positive electrode.

Also, the electronic scanning ultrasonic probe according to Japanese Unexamined Patent Application Publication No. 2-271843 has been disclosed wherein a damper member is flowed into a cylinder made up of a transducer unit to make up a radial scanning ultrasonic probe.

SUMMARY OF THE INVENTION

An ultrasonic transducer according to the present invention comprises: an acoustic matching layer including at least a layer made up of a hard material; a piezoelectric member of which the length dimension is shorter than this acoustic matching layer, which is fixed and disposed at a predetermined position of a layer made up of the hard material which makes up the acoustic matching layer, and divided into a plurality of piezoelectric devices in this disposed state; and a transducer shape-formative member made up of a hard material, wherein, in a state in which the surfaces of the piezoelectric devices divided and formed are disposed on the inner circumferential surface side, the plurality of piezoelectric devices are arrayed in a predetermined shape, fixed and disposed on the surface where the piezoelectric devices of the acoustic matching layer protruding from the piezoelectric devices have been disposed. A method for manufacturing an ultrasonic transducer according to the present invention comprises: a process for forming an acoustic matching layer which layers at least a first acoustic matching layer made up of a hard material, and a second acoustic matching layer made up of a soft material; a process for forming a layered member by fixing a predetermined-shaped piezoelectric member having electrodes on the first acoustic matching layer surface of the acoustic matching layer; a process for providing a predetermined number of piezoelectric devices on the layered member by forming dividing grooves in a predetermined interval on the piezoelectric member; a process for configuring the layered member in a predetermined shape by disposing a shape-formative member at a predetermined position of the layered member having a plurality of piezoelectric devices; a process for putting the layered member formed in a predetermined shape in a turning state, and supplying a liquid resin mixed with filler on the layered member inner circumferential surface; and a process for putting the layered member in a turning state for a predetermined period, and hardening the liquid resin supplied on the layered member inner circumferential surface. Accordingly, residual stress can be prevented from occurring in a sure manner by disposing a liquid resin to which filler is mixed on the piezoelectric devices without using an adhesive agent. Also, a liquid resin to which filler is mixed is disposed evenly to each piezoelectric device, thereby yielding an ultrasonic transducer having uniform acoustic properties.

DESCRIPTION OF THE PREFERRED EMBODIMENT(S)

The present invention will be described in more detail with reference to the appended drawings.

Figure 1:
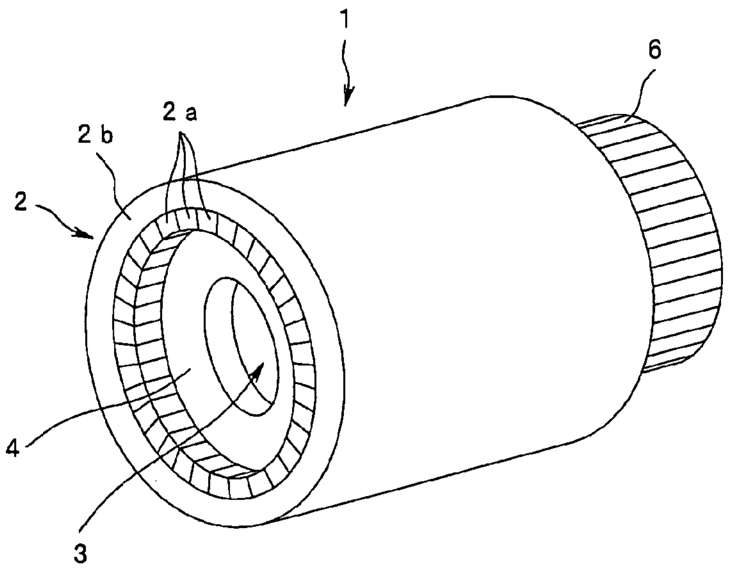
FIG. 1 is a perspective view illustrating an ultrasonic transducer.

As shown in FIG. 1, an ultrasonic transducer 1 according to the present embodiment is configured as a radial array type. The ultrasonic transducer 1 comprises an acoustic matching layer 2, a backing member 3, a first transducer shape-formative member 4*a* formed in a cylindrical shape, a second transducer shape-formative member (hereafter, abbreviated as shape-formative member) 4*b*, and a piezoelectric device 5. The acoustic matching layer 2 is formed by layering a first acoustic matching layer 2*a* made up of a hard material, and a second acoustic matching layer 2*b* made up of a soft material. Here, the term "hard" means a degree of hardness wherein a shape formed beforehand can be maintained. On the other hand, the term "soft" means to have flexibility regarding deformation and so forth.

Figure 3:
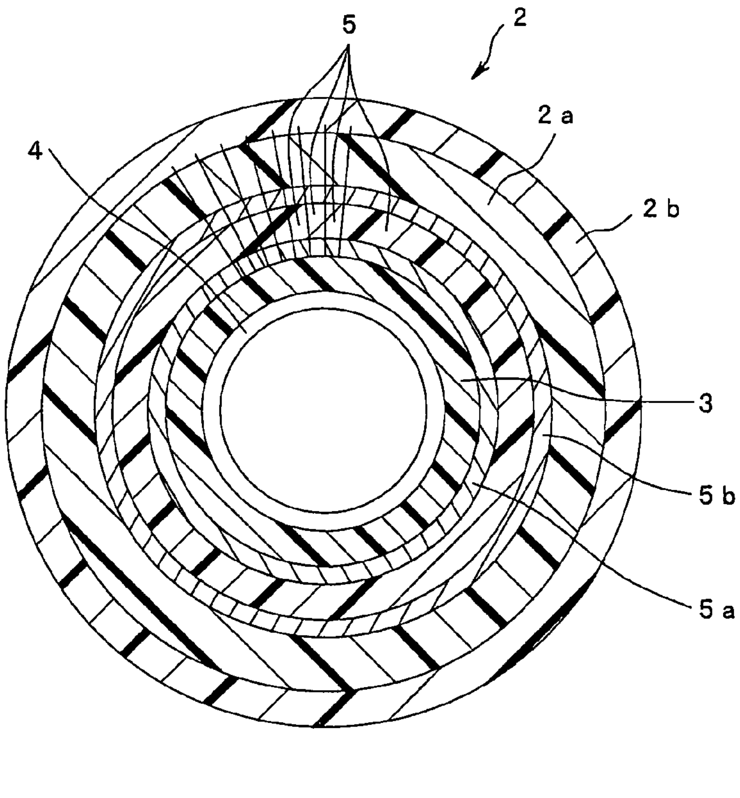
FIG. 3 is a cross-sectional view taken along line A-A in FIG. 2A.
Figure 2A:
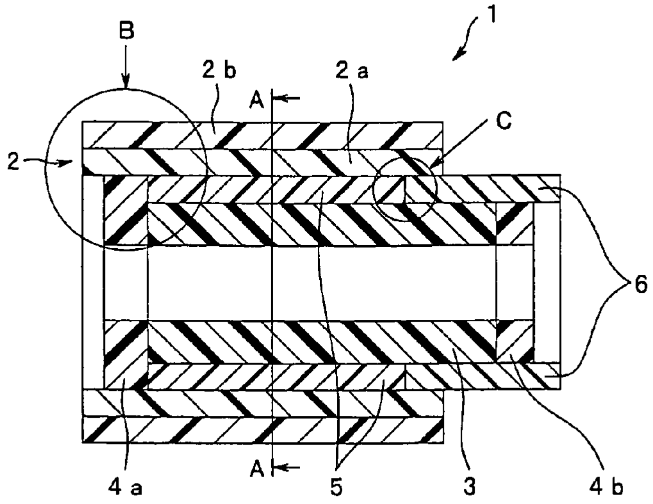
FIG. 2A is a cross-sectional view in the longitudinal direction for describing the configuration of the ultrasonic transducer.

As shown in FIG. 2A and FIG. 3, the backing member 3, the piezoelectric device 5, the first acoustic matching layer 2*a*, and the second acoustic matching layer 2*b* are disposed in order from the center of the cylindrical shape of the ultrasonic transducer 1 toward the outer circumferential side. The first shape-formative member 4*a* is disposed so as to be adjacent to one end sides of the backing member 3 and the piezoelectric device 5 in the inner direction of the first acoustic matching layer 2*a* making up the acoustic matching layer 2. A substrate 6 is disposed on the other end side of the piezoelectric device 5.

Note that the substrate 6 is also formed in a cylindrical shape by simulating the shape of the ultrasonic transducer 1 and the like. As for the substrate 6, a three-dimensional substrate, an alumina substrate, a glass epoxy substrate, a rigid flexible substrate, a flexible substrate, or the like is employed.

The second shape-formative member 4*b* is disposed so as to be adjacent to the other end side of the backing member 3 in the inner circumferential side of the substrate 6. Also, the acoustic matching layer 2 is disposed on one end side serving as a side wherein the first shape-formative member 4*a* of the ultrasonic transducer 1 is disposed, so as to protrude in the longitudinal axial direction as-compared with the piezoelectric device 5.

The acoustic matching layer 2 is made up of the first acoustic matching layer 2*a* and the second acoustic matching layer 2*b* as described above, but as for a material of the first acoustic matching layer 2*a*, for example, a material obtained by mixing a resin member such as epoxy, silicone, polyimide, or the like with a powder member or fiber such as metal, ceramic, glass, or the like, or glass, machinable ceramics, silicon, or the like is employed. On the other hand, as for a material of the second acoustic matching layer 2*b*, for example, a resin member such as silicone, epoxy, PEEK, polyimide, polyetherimide, polysulfone, polyethersulfone, fluororesin, or the like, or rubber or the like is employed.

As shown in FIG. 1 and FIG. 3, the first acoustic matching layer 2*a* and the piezoelectric device 5 are divided into a predetermined number, e.g., 192, and arrayed.

As for the backing member 3, a member obtained by hardening an epoxy resin including alumina powder is employed, for example. Note that as the backing member 3, a resin member such as epoxy, silicon, polyimide, polyetherimide, PEEK, urethane, fluorine, or the like, a rubber member such as chloroprene rubber, propylene rubber, butadiene rubber, urethane rubber, silicone rubber, fluororubber, or the like, or a member obtained by mixing such a resin member or rubber member with metal such as tungsten, ceramics such as alumina, zirconia, silica, tungstic oxide, piezoelectric ceramics powder, ferrite, or the like, or a powder member or fiber such as glass or resin or the like, or a single or plurality of fillers in material or a shape made up of hollow particles, or the like, may be employed.

The piezoelectric device 5 is formed by cutting a piezoelectric ceramic such as lead zirconate titanate, lead titanate, barium titanate, BNT-BS-ST, or the like, or piezoelectric crystal or relaxor ferroelectric such as $LiNbO_3$ or PZNT or the like, which is formed in a plate shape. A one-face side electrode 5*a* and an other-face side electrode 5*b* are obtained by providing an electroconductive member such as gold, silver, copper, nickel chrome, or the like on the surface of the plate-shaped piezoelectric ceramic beforehand as a single layer, multi layer, or alloy layer by sintering or by a thin film or plating such as vapor deposition, sputtering, ion plating, or the like.

Now, description will be made regarding an electroconductive system in the ultrasonic transducer 1 based on FIG. 2B through FIG. 2D serving as partially enlarged views of the range B in FIG. 2A, and FIG. 2E serving as a partially enlarged view of the range C.

Figure 2B:
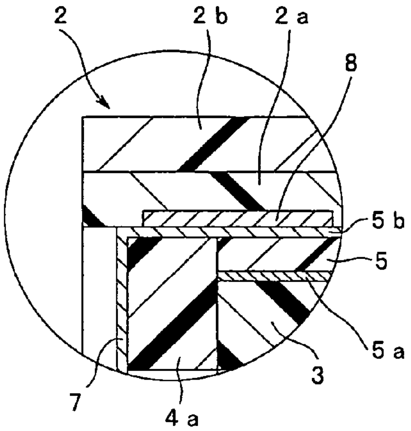
FIG. 2B is an enlarged view of the portion shown with the arrow B in FIG. 2A.
Figure 2C:
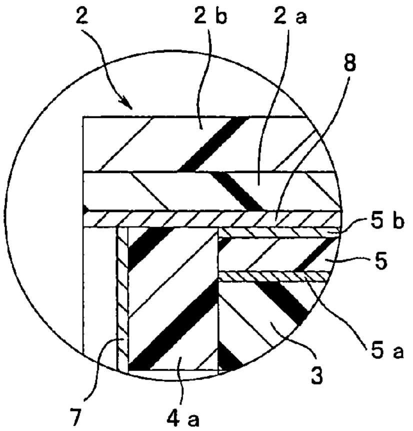
FIG. 2C is a diagram for describing another configuration example of the portion shown with the arrow B in FIG. 2A.

As shown in FIG. 2B, the inner circumferential side of the piezoelectric device 5 is provided with the one-face side electrode 5*a*, and the outer circumferential side thereof is provided with the other-face side electrode 5*b*. On the inner circumferential side of the first acoustic matching layer 2*a* making up the acoustic matching layer 2, a ground electrode 8 is disposed and formed along generally the entire circumference. The ground electrode 8 is in contact with the electrode 5*b* provided on the outer circumference of the piezoelectric device 5 and with an electroconductive portion 7 provided on the outer circumference of the first shape-formative member 4*a*.

Note that description will be made later regarding placement of the ground electrode 8 as well as description regarding the manufacturing method.

The first shape-formative member 4*a* is bonded and fixed to the inner circumferential face of the first acoustic matching layer 2*a* with an electroconductive member, e.g., an electroconductive adhesive agent (not shown). Thus, the electroconductive portion 7 and the ground electrode 8 become an electroconductive state. Note that the electroconductive member is not restricted to an electroconductive adhesive agent, a brazing metal member such as solder, brazing silver, brazing gold, or the like, or an electroconductive film or the like may be employed.

Thus, the other-face side electrode 5*b*, the electroconductive portion 7, and the ground electrode 8 are electrically connected.

In FIG. 2B, the other-face side electrode 5*b* and the electroconductive portion 7 are integrally formed, but the other-face side electrode 5*b*, the electroconductive portion 7, and the ground electrode 8 should be connected so as to be electrically equal. For example, as shown in FIG. 2C, the ground electrode 8 may be consecutively provided up to one end side of the acoustic matching layer 2.

Figure 2D:
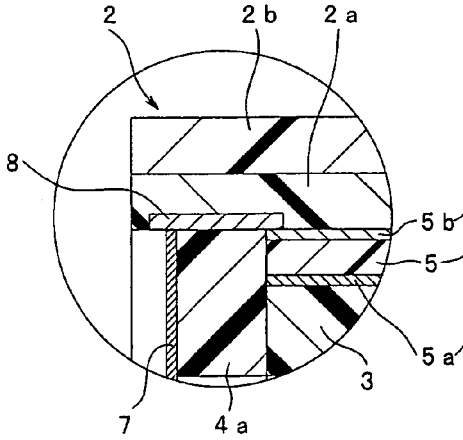
FIG. 2D is a diagram for describing another configuration example of the portion shown with the arrow B in FIG. 2A.

Also, as shown in FIG. 2D, an arrangement may be made wherein the ground electrode 8 may be made a little larger than the thickness of the first shape-formative member 4*a* serving as the length of the longitudinal axial direction thereof such that only a part of around the longitudinal direction thereof is in contact with the other-face side electrode 5*b* and the electroconductive portion 7. In this case, let us say that the ground electrode 8 is configured so as to be exposed to the outside, and between the electroconductive portion 4*a* and the ground electrode 8 is in an electroconductive state with an electroconductive member such as an electroconductive resin, electroconductive painting, or the like, or an electroconductive film such as various types of electroconductive thin film, electroconductive thick film, plating, or the like. Also, a combination of these materials may be employed.

Figure 2E:
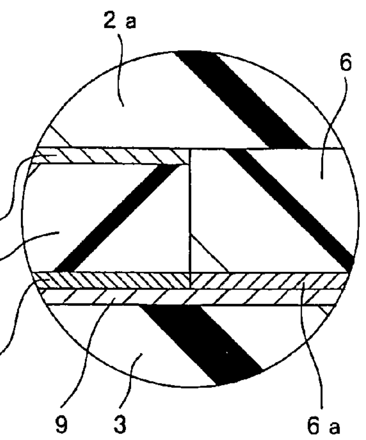
FIG. 2E is an enlarged view of the portion shown in the arrow C in FIG. 2A.

As shown in FIG. 2E, in the vicinity of a portion where the piezoelectric device 5 and the substrate 6 are adjacently disposed, an electroconductive member 9 is disposed in the inner circumferential side of the backing member 3 so as to electrically connect the electroconductive pattern 6*a* provided in the inner circumferential side of the substrate 6, and the one-face side electrode 5*a*.

A method for manufacturing the ultrasonic transducer 1 configured as described above will be described with reference to FIG. 4A through FIG. 10C.

The method for manufacturing the ultrasonic transducer 1 comprises the following processes.

(1) Process for Forming the Acoustic Matching Layer 2

Figure 4A:
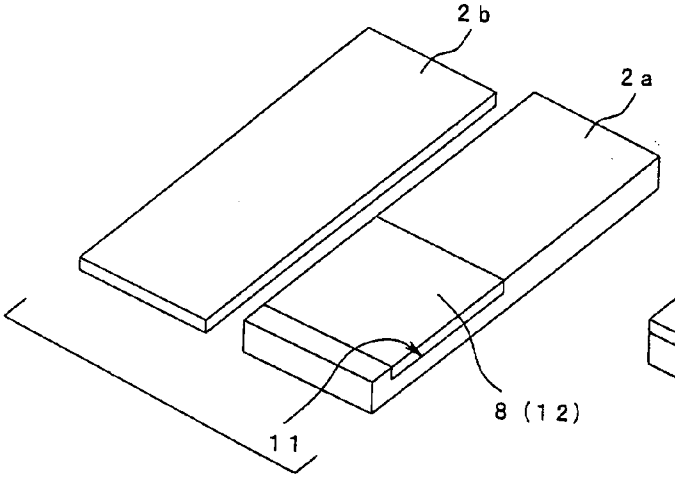
FIG. 4A is a diagram for describing members making up an acoustic matching layer.

In order to form the acoustic matching layer 2, first, the first acoustic matching layer 2*a* and the second acoustic matching layer 2*b*, which have predetermined dimensions and a predetermined shape as shown in FIG. 4A, and also are adjusted to a predetermined acoustic impedance value, are prepared. Subsequently, the ground electrode 8 in a plate shape is disposed at a predetermined position on one face side of the first acoustic matching layer 2*a*.

Figure 4B:
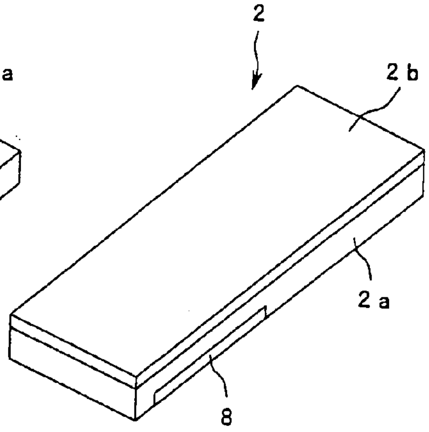
FIG. 4B is a diagram for describing the acoustic matching layer.

Next, as shown in FIG. 4B, the acoustic matching layer 2 is formed by integrally layering the first acoustic matching layer 2*a* and the second acoustic matching layer 2*b*. At this time, the second acoustic matching layer 2*b* is disposed on the other face side of the first acoustic matching layer 2*a* on which the ground electrode 8 is not provided. The acoustic matching layer 2 may be integrated following each of the first acoustic matching layer 2*a* and the second acoustic matching 2*b* being formed in a predetermined thickness, or may be formed in a predetermined thickness following integration, or may be directly formed by applying or casting or film-forming one to the other without bonding, or may be formed by a combination of these.

Note that as for the ground electrode 8, an electroconductive member 12 in a plate shape formed with a predetermined width dimension and thickness dimension may be bonded and disposed in a groove 11 formed with a predetermined width dimension and depth dimension at a predetermined position of the first acoustic matching layer 2*a*. Also, as for the ground electrode 8, a plate-shaped electroconductive member formed with a predetermined width dimension and thicker dimension than the above depth dimension may be bonded and disposed in the groove 11. Also, as for the ground electrode 8, following an unshown electroconductive resin or the like being applied or filled so as to be protruded, the protruding portion of this electroconductive member may be worked and formed such that the face thereof matches the face of the first acoustic matching layer 2*a*. Also, as for the ground electrode 8, following an electroconductive member being bonded, applied, or filled in the groove 11 of the first acoustic matching layer 2*a* formed with thicker dimension than a predetermined thickness dimension, the entirety may be worked and formed so as to become a predetermined thickness dimension. Also, the ground electrode 8 may be formed by various types of conductive film.

As for the ground electrode 8, a conductive material such as an electroconductive resin, electroconductive painting, metal, or the like, or a conductive film such as various types of conductive thin film, conductive thick film, plating, or the like is employed.

(2) Process for Forming the First Layered Member

A first layered member 21 is formed from the acoustic matching layer 2 formed in the first process, and a piezoelectric ceramic 13 wherein the one-face side electrode 5*a* and the other-face side electrode 5*b* are provided on both faces of a piezoelectric device. With the piezoelectric ceramic 13, the length dimension is formed shorter than the length dimension of the acoustic matching layer 2 by a predetermined dimension, the width dimension is formed with generally the same dimension, and the thickness dimension is formed with a predetermined dimension.

Figure 5A:
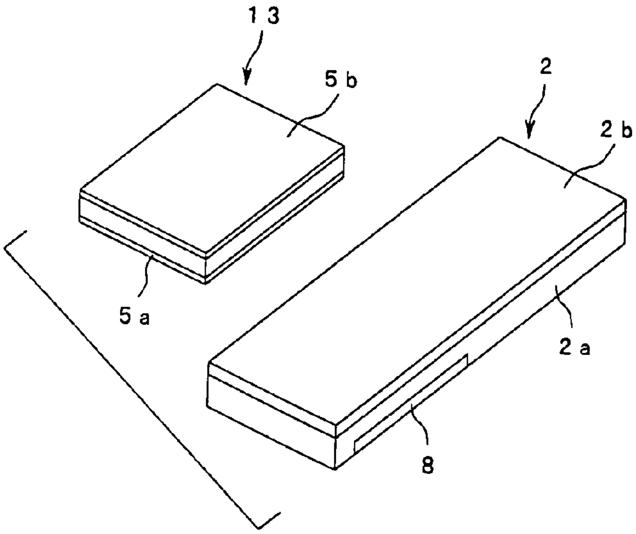
FIG. 5A is a diagram for describing members making up a first layered member.

Specifically, first, the acoustic matching layer 2 and the piezoelectric ceramic 13 are prepared as shown in FIG. 5A.

Figure 5B:
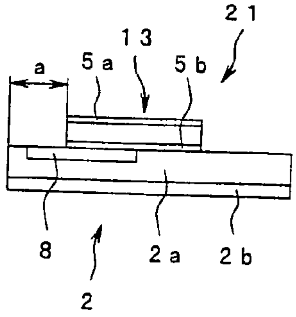
FIG. 5B is a diagram for describing the first layered member.

Next, as shown in FIG. 5B, the other-face side electrode 5*b* of the piezoelectric ceramic 13 is bonded and fixed at a position shifted by, for example, a distance a serving as a predetermined amount from one side of the generally rectangular acoustic matching layer 2 on the surface of the acoustic matching layer 2 on which the ground electrode 8 is formed such that at least part thereof is in contact with the ground electrode 8.

Thus, the integral first layered member 21 is formed in an electroconductive state between the other-face side electrode 5*b* and the ground electrode 8 of the piezoelectric ceramic 13. At this time, one end face side of the acoustic matching layer 2 on which the ground electrode 8 is disposed becomes a protruding state from one end face side of the piezoelectric ceramic 13 by the distance a.

(3) Process for Forming a Second Layered Member

A second layered member 22 is formed from the first layered member 21 formed in the above process, and electroconductive patterns 6*a*.

Figure 6A:
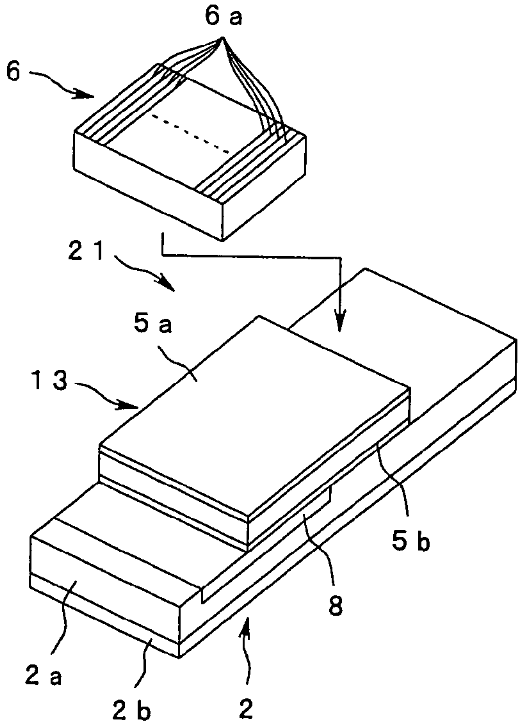
FIG. 6A is a diagram for describing members making up a second layered member.

First, as shown in FIG. 6A, the first layered member 21 formed in the second process and the substrate 6 of which one face sides are regularly arrayed with a plurality of electroconductive patterns 6*a*, . . . , 6*a* in a predetermined interval, are prepared. The thickness dimension of this substrate is generally the same as the thickness dimension of the piezoelectric ceramic 13.

Figure 6B:
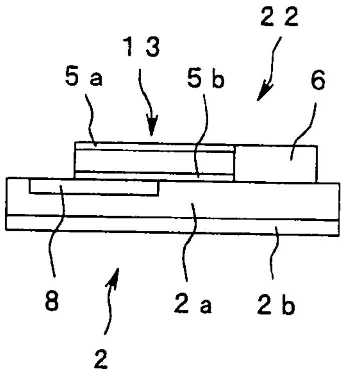
FIG. 6B is a diagram for describing the second layered member.

Next, as shown in FIG. 6B, the substrate 6 is disposed in a state wherein the electroconductive patterns 6*a*, . . . , 6*a* are turned upward so as to be adjacent to the piezoelectric ceramic 13, and bonded and fixed as to the first acoustic matching layer 2*a*.

Thus, the second layered member 22 is formed wherein the piezoelectric ceramic 13 and the substrate 6 are adjacently disposed on the face of the first acoustic matching layer 2*a*. Note that the width dimension and length dimension of the substrate 6 are set to be predetermined dimensions.

(4) Process for Electrically Connecting the Electroconductive Patterns 6*a*, . . . , 6*a* of the Substrate and the One-Face Side Electrode 5*a* of the Piezoelectric Ceramic 13

Figure 7:
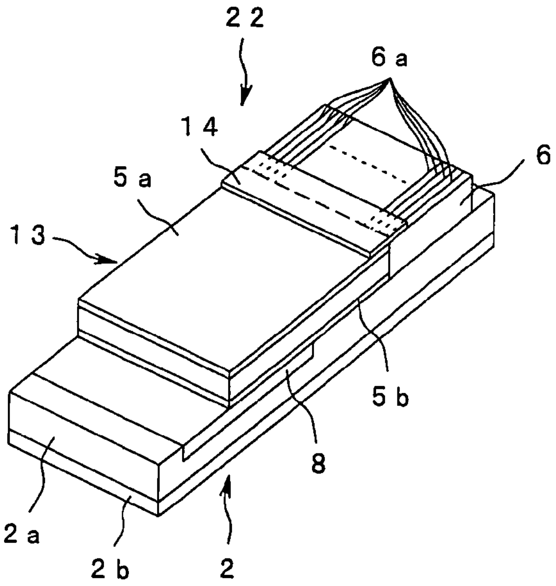
FIG. 7 is a diagram for describing a process for electrically connecting an electroconductive pattern of a substrate and a one-face side electrode of a piezoelectric ceramic.

As shown in FIG. 7, an electroconductive film portion 14 is provided by disposing an unshown mask member at a predetermined position on the surface of the piezoelectric ceramic 13 on which the one-face side electrode 5*a* is provided, and the substrate 6 on which the electroconductive patterns 6*a* of the second layered member 22 are formed, applying electroconductive painting or an electroconductive adhesive agent or the like serving as a film member thereupon, or accreting metal such as gold, silver, chrome, indium dioxide, or the like, or a conductive member by means of vapor deposition, sputtering, ion plating, CVD, or the like.

The electroconductive film portion 14 is thus formed, thereby electrically connecting the electroconductive patterns 6*a*, . . . , 6*a* and the one-face side electrode 5*a*.

(5) Process for Dividing the Piezoelectric Ceramic 13 Into a Plurality of Piezoelectric Devices 5, . . . , 5

Figure 8A:
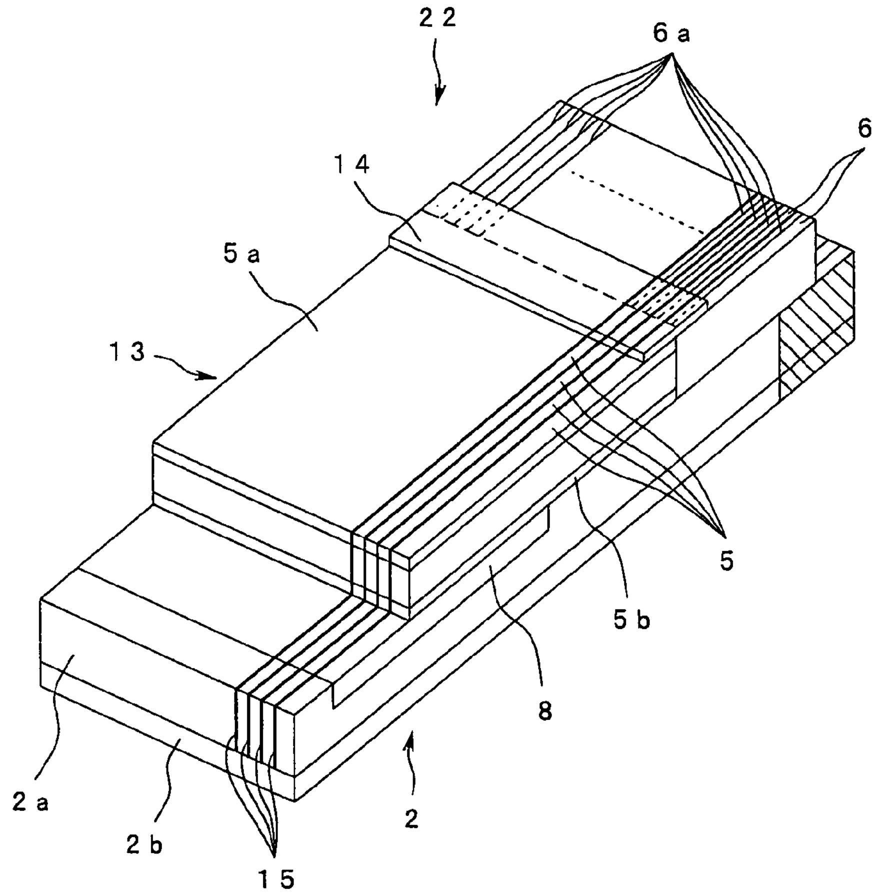
FIG. 8A is a diagram illustrating a state wherein dividing grooves are formed, and the piezoelectric ceramic is divided into piezoelectric devices.

As shown in FIG. 8A, dividing grooves 15 having a predetermined depth dimension, and a predetermined width dimension or a predetermined shape which passes through the first acoustic matching layer 2*a* making up the acoustic matching layer 2 from the surface side of the piezoelectric ceramic 13 and the substrate 6, and reaches part of the second acoustic matching layer 2*b* are formed with a predetermined pitch in the direction orthogonal to the longitudinal direction. Note that the dividing grooves 15 are formed using cutting means such as an unshown dicing saw or laser apparatus, or the like. At this time, the cutting means are disposed on the center line, which divides the two electroconductive patterns 6*a* and 6*a*.

With this process, the substrate 6 on which the plurality of electroconductive patterns 6*a*, . . . , 6*a* are provided is divided into a plurality of substrates 6, . . . , 6 on which at least the single electroconductive pattern 6*a* is disposed, and also the piezoelectric ceramic 13 is divided into a plurality of piezoelectric ceramics 13. At this time, the electroconductive film portion 14 is divided into a plurality of electroconductive members 9. Thus, a plurality of piezoelectric devices 5, . . . , 5 which electrically connect the respective electroconductive patterns 6*a* with the electroconductive members 9 are arrayed on the single acoustic matching layer 2.

Figure 8B:
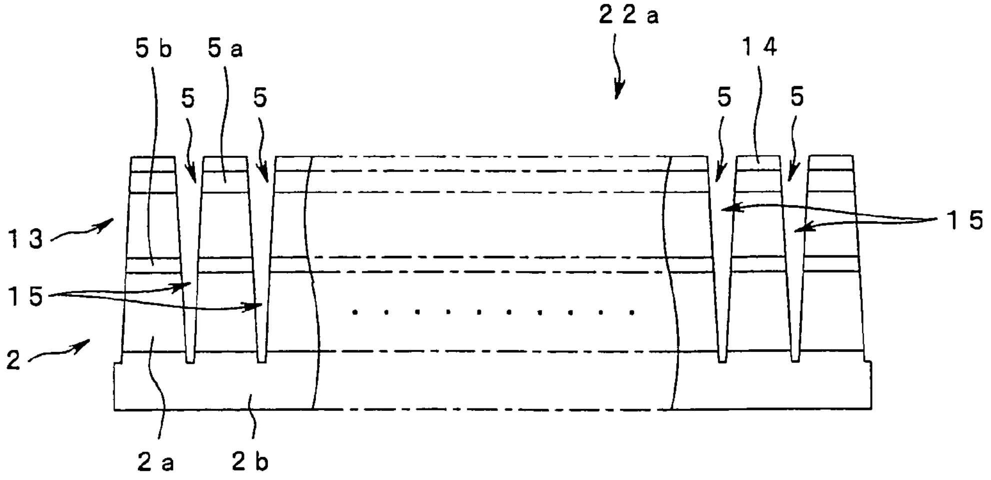
FIG. 8B is a side view of the second layered member having dividing grooves formed in a cutting process as viewed from the cutting direction.

As shown in FIG. 8B, a predetermined number of dividing grooves 15 are formed with a predetermined pitch in the second layered member 22. Thus, the piezoelectric ceramic 13, the substrate 6, the electroconductive film portion 14, and the first acoustic matching layer 2*a* are divided into a predetermined number, the second layered member 22 made up of the piezoelectric ceramic 13 and the substrate 6 becomes a second layered member 22*a* made up of a group of layered members on which the plurality of piezoelectric devices 5, . . . , 5 and the plurality of substrates 6, . . . , 6 are disposed. In other words, it can be said that the second layered member 22 becomes a state wherein the plurality of piezoelectric devices 5, . . . , 5 are arrayed on the second acoustic matching layer 2*b* having flexibility making up the acoustic matching layer 2.

Figure 9:
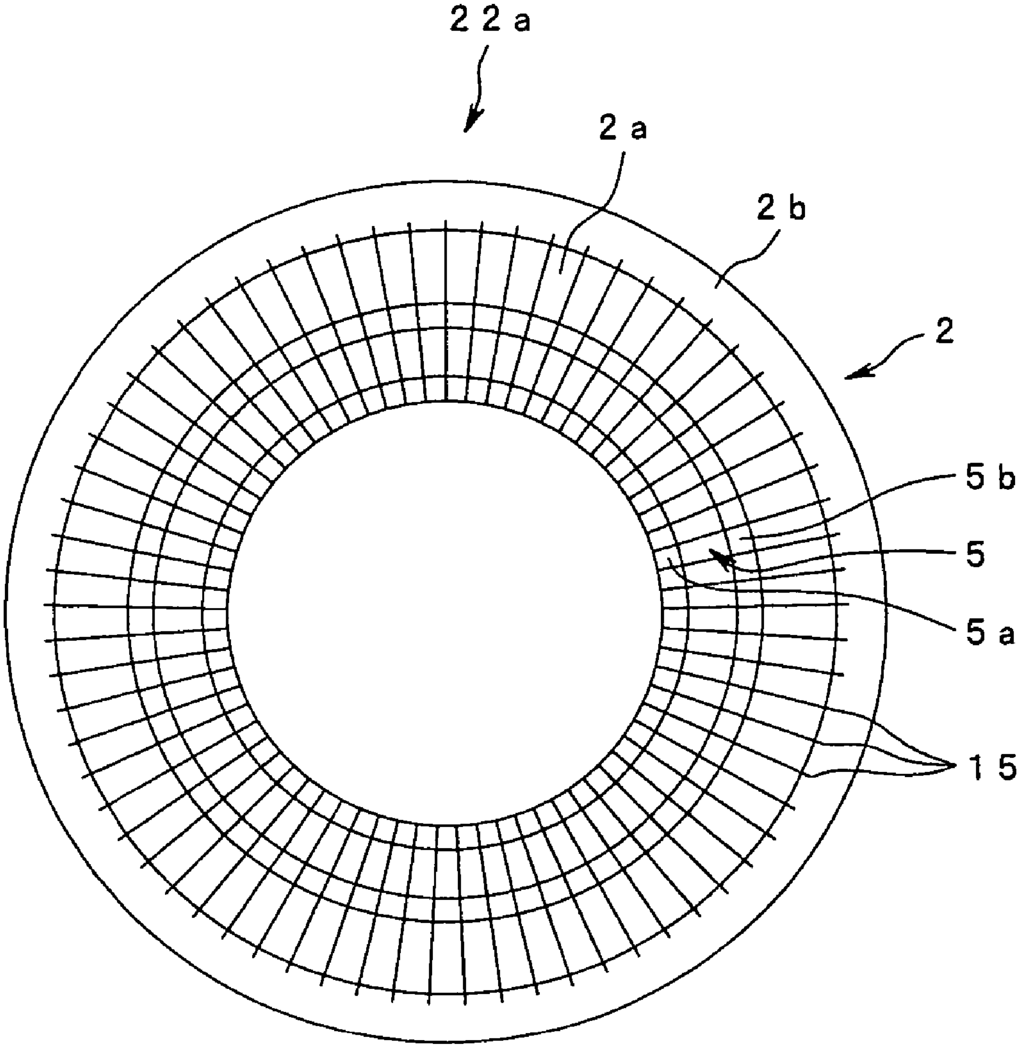
FIG. 9 is a diagram wherein the second layered member on which a plurality of piezoelectric devices are provided is deformed to a cylindrical shape.

Subsequently, the second layered member 22*a* is subjected to curved deformation such that the second acoustic matching layer 2_b_ is disposed on the outermost circumferential side, and formed in a cylindrical shape as shown in FIG. 9.

Note that following the dividing grooves 15 being formed, the acoustic matching layer 2 shown with hatched lines in FIG. 8A for example is removed, which is unnecessary for forming the ultrasonic transducer 1. Also similarly, with regard to the respective members making up the second layered member 22, an arrangement may be made wherein the lengths thereof for example are employed greater than predetermined shapes, and consequently, unnecessary portions are removed. Further as necessary, an electroconductive check regarding whether or not the one-face side electrode 5_a_ of the respective piezoelectric devices 5, . . . , 5 is electrically connected to the electroconductive pattern 6_a_ of the respective substrates 6, . . . , 6 through the electroconductive member 9.

(6) Process for Forming a Cylindrical Transducer Unit (Hereafter, Abbreviated as Cylindrical Unit) 23

A cylindrical unit 23 is formed from the second layered member 22_a_ formed in the above process, and the first and second shape-formative members 4_a_ and 4_b_.

Figure 10A:
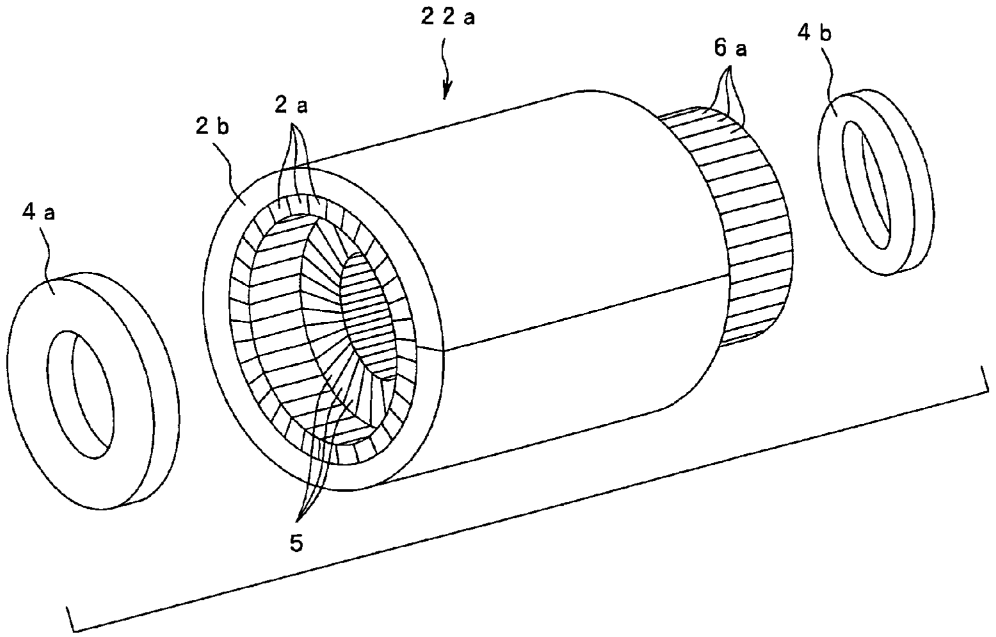
FIG. 10A is a diagram for describing members making up a cylindrical transducer unit.
Figure 10B:
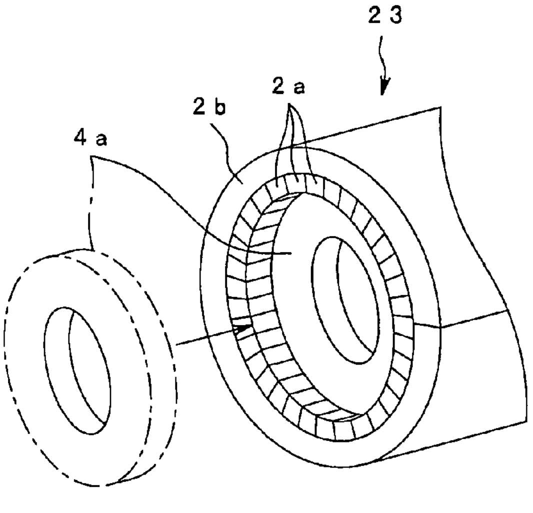
FIG. 10B is a diagram for describing a state wherein a shape-formative member is disposed in a first acoustic matching layer.
Figure 10C:
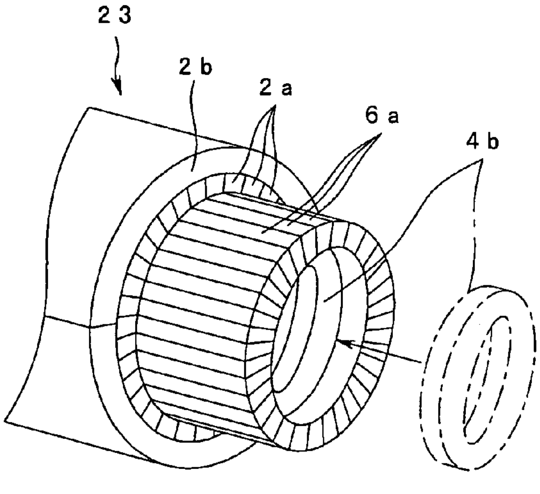
FIG. 10C is a diagram for describing a state wherein a shape-formative member is disposed in the substrate.

Specifically, following the second layered member 22_a_ being formed in a cylindrical shape as shown in FIG. 10A, the first shape-formative member 4_a_ is integrally bonded- and fixed to the first acoustic matching layer 2_a_ of the acoustic matching layer 2 with an electroconductive adhesive agent, as shown in FIG. 10B. Also, as shown in FIG. 10C, the second shape-formative member 4_b_ is integrally bonded and fixed to the inner circumferential surface side of the substrates 6, . . . , 6 adjacent to the piezoelectric devices 5, . . . , 5 with a non-electroconductive adhesive agent.

Thus, the cylindrical unit 23 having a predetermined curvature is formed from the second layered member 22_a_ by bonding and fixing the first acoustic matching layer 2_a_ made up of a hard material, the first shape-formative member 4_a_ and the substrate 6, and the second shape-formative member 4_b_. At this time, the ground electrode 8 in an electroconductive state as to the other-face side electrode 5_b_ provided on the divided piezoelectric devices 5, . . . , 5, and the electroconductive portion 7 of the first shape-formative member 4_a_ become an integrally electroconductive state.

The electroconductive portion 7 is connected with a ground wire extending from an unshown ultrasonic observation apparatus, thereby ensuring ground having sufficient capacity. Now, an arrangement may be made wherein the first shape-formative member 4_a_ is bonded to the first acoustic matching layer 2_a_ using a non-electroconductive adhesive agent, following which may be electrically connected by means of a conductive thin film, an electroconductive resin, a conductive thick film, or the like.

Thus, the other-face side electrode 5_b_ provided on the respective piezoelectric devices 5, . . . , 5 is connected to the ground electrode 8 integrated by the electroconductive portion 7 so as to ensure ground having large capacity by providing the ground electrode 8 on the acoustic matching layer 2 beforehand, which becomes an electroconductive state as to a predetermined electrode and the electroconductive portion of a predetermined shape-formative member provided on the piezoelectric ceramic 13, and electrically connecting this ground electrode 8 and the predetermined electrode and the electroconductive portion 7 of the predetermined shape-formative member provided on the piezoelectric ceramic 13 at the time of an assembly process.

Figure 11A:
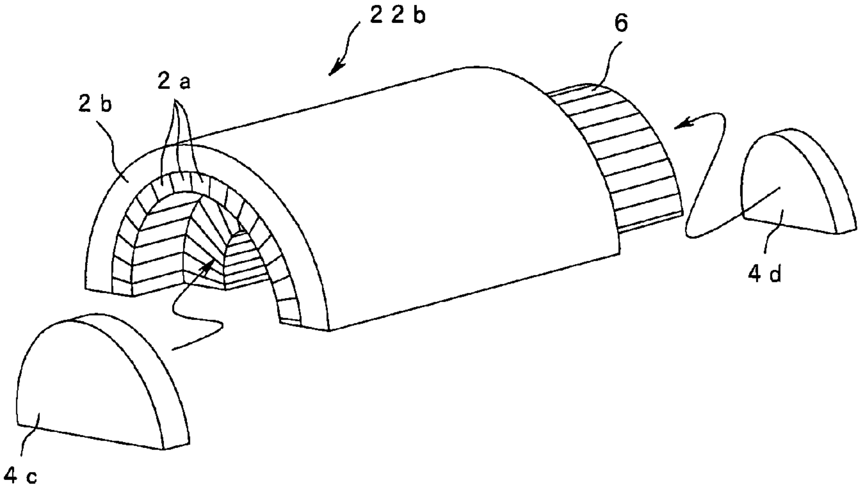
FIG. 11A is a diagram illustrating shape-formative members and a second layered member for forming a convex-array transducer unit.

Note that with the present embodiment, the process for forming the radial-array ultrasonic transducer 1 using the first shape-formative member 4_a_ and the second shape-formative member 4_b_ has been described, but instead of employing the shape-formative members 4_a_ and 4_b_ shown in the present process, a convex-array transducer unit may be formed by fixing a third shape-formative member 4_c_ and a fourth shape-formative member 4_d_ formed in a partially cylindrical shape for example as shown in FIG. 11A to the first acoustic matching-layer 2_a_ of the second layered member 22_b_ having the piezoelectric devices 5, . . . , 5 which are divided into a predetermined number in a predetermined shape, as with the above description.

Figure 11B:
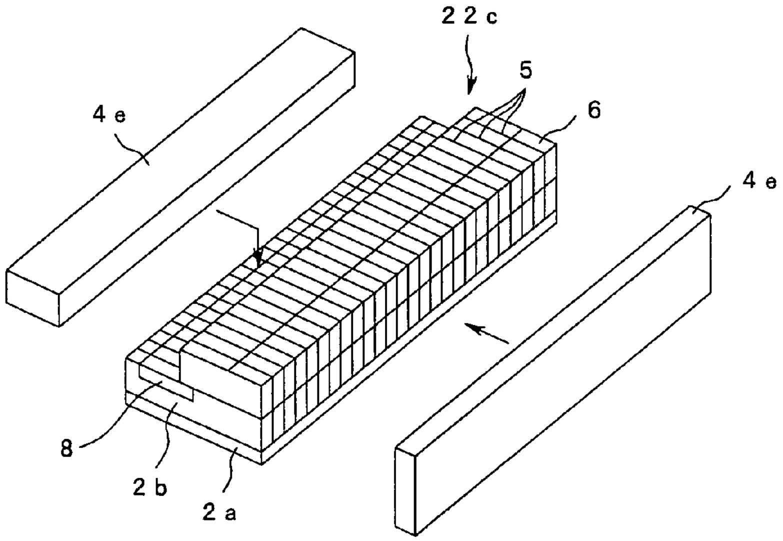
FIG. 11B is a diagram illustrating shape-formative members and a second layered member for forming a linear-array transducer unit.

Now, as shown in FIG. 11B, a linear-array transducer unit is formed by fixing the shape-formative member 4_e_ of which the end portion is flat such that the flat portion is in contact with the first acoustic matching layer 2_a_ of the second layered member 22_c_, as with the above description. Further, the end portion shape of the shape-formative member is not restricted to an arc or a straight line, and a combination of these and deformation may be employed, whereby a plurality of arrays can be disposed without restriction, and accordingly, the ultrasonic scanning direction may be set without restriction.

Figure 12:
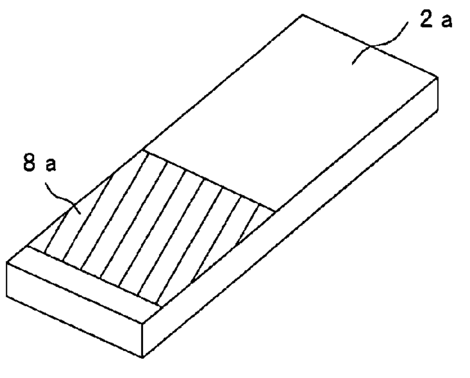
FIG. 12 is a diagram for describing another method for forming a ground electrode to be provided on the first acoustic matching layer.

Also, with the present embodiment, the ground electrode 8 is configured by bonding and disposing the plate-shaped electroconductive member 12 in the groove 11 having a predetermined width dimension and depth dimension formed at a predetermined position of the first acoustic matching layer 2_a_, but as shown in FIG. 12, a ground film portion 24 made up of an electroconductive material may be provided at a predetermined position of the first acoustic matching layer 2_a_. Specifically, the ground film portion 24 may be formed by subjecting an electroconductive member such as gold, silver, copper, nickel chrome, or the like to sintering, vapor deposition, or the like, or may be formed by applying electroconductive painting, an electroconductive adhesive agent, or the like.

Thus, the ground electrode 8 can be provided at a predetermined position of the first acoustic matching layer 2_a_ without forming a groove having a predetermined width dimension and depth dimension at a predetermined position of the first acoustic matching layer 2_a_.

(7) Process for Forming the Backing Member

A radial-array ultrasonic transducer having a configuration such as shown in FIG. 1 through FIG. 3 is formed by forming the backing member 3 using a rubber member including ferrite, epoxy including alumina powder, or the like as a material by means of a method such as bonding, casting, or the like, on the one-face side electrode 5_a_ side of the piezoelectric device 5.

Description thereof will be made below.

Figure 13:
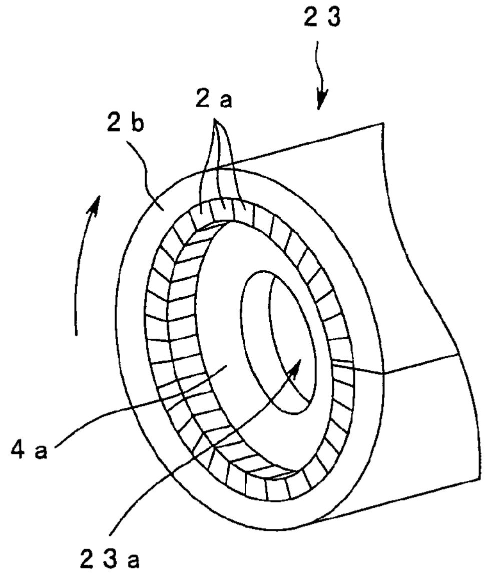
FIG. 13 is a diagram for describing a cylindrical transducer unit in a turning state.
Figure 14:
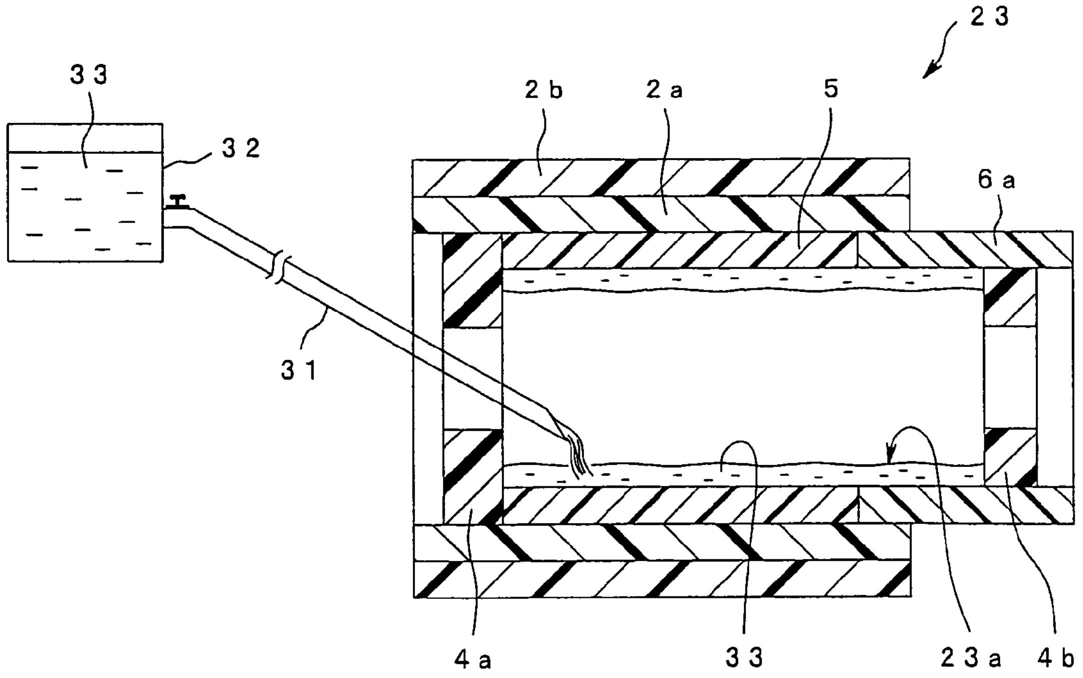
FIG. 14 is a diagram for describing a state wherein a liquid resin is supplied to the inner circumferential surface of the cylindrical transducer unit.

As shown in FIG. 13, a cylindrical unit 23 is mounted on an unshown tool, and this cylindrical unit 23 is turned in the direction shown in the arrow for example at a predetermined speed with the center of curvature as a turning axis. In this state, as shown in FIG. 14, a liquid resin 33 having predetermined viscosity in which alumina powder is mixed in an epoxy resin and stirred with a mixing apparatus 32 beforehand, is supplied to the inner circumferential surface 23_a_ of the cylindrical unit 23 via a supplying pipe 31. Next, a predetermined amount of the liquid resin 33 is supplied in a state wherein the cylindrical unit 23 is turning, and then the turning state is maintained for a predetermined period, following which the liquid resin 33 is hardened. Note that the turning direction of the cylindrical unit 23 is not restricted to the direction shown in the arrow, and may be the opposite direction thereof.

Thus, the radial-array ultrasonic transducer 1 is formed wherein the backing member 3 is provided on the one-face side electrode 5*a* side of the plurality of piezoelectric devices 5, . . . , 5.

Figure 15:
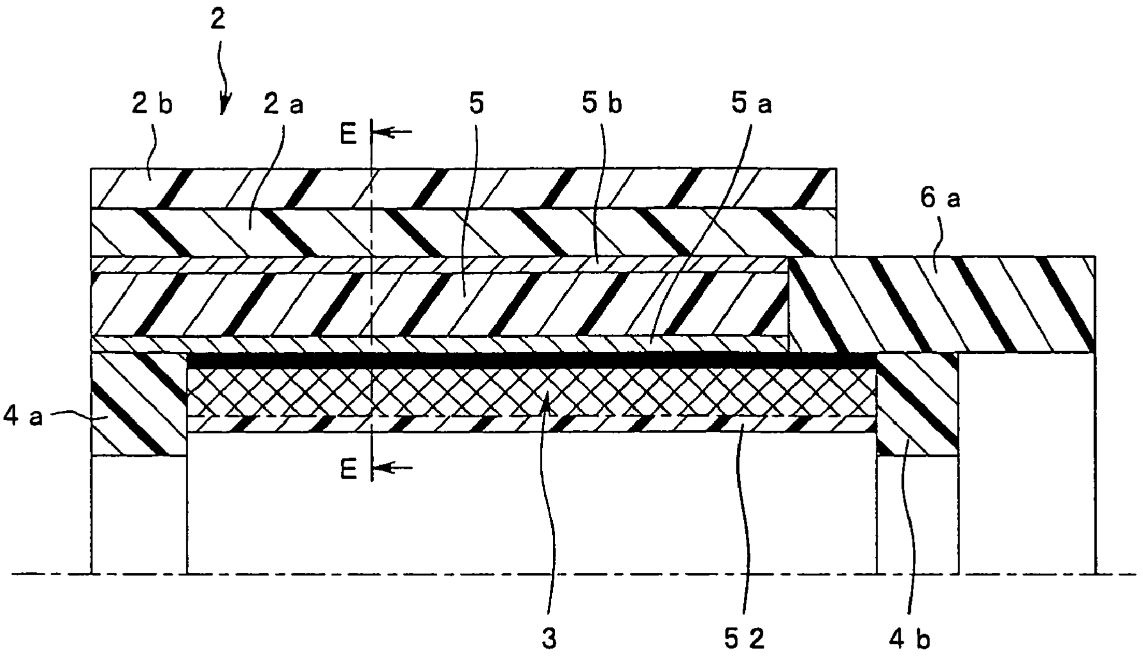
FIG. 15 is a cross-sectional view in the longitudinal direction of a cylindrical ultrasonic transducer.
Figure 16:
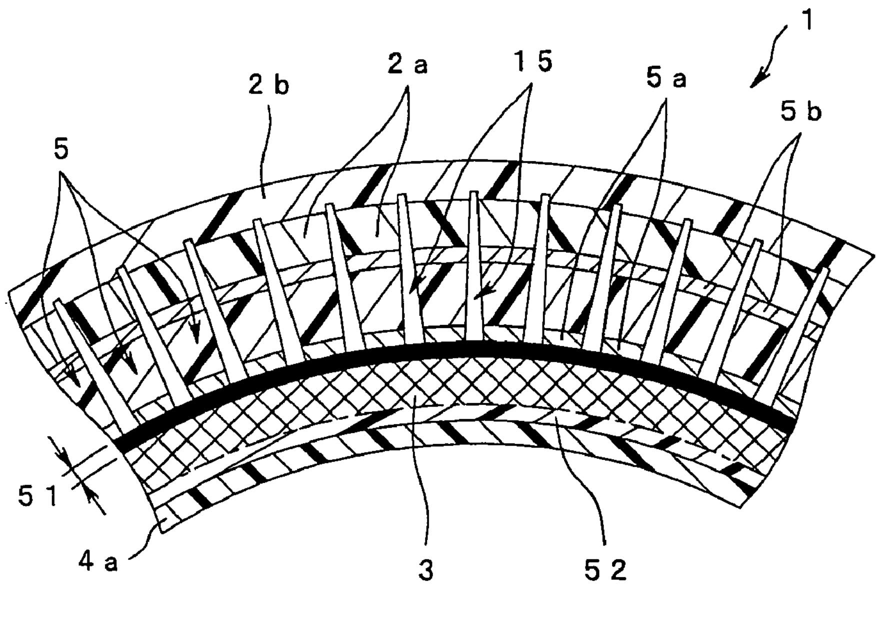
FIG. 16 is a cross-sectional view taken along line E-E of FIG. 15.

At this time, the backing member 3 is formed by the liquid resin 33 being hardened in a state wherein the cylindrical unit 23 is turning, so is formed with uniform thickness as to the respective piezoelectric devices 5, . . . , 5 as shown in FIG. 15, and also is formed in a state wherein alumina powder is evenly distributed to the center direction from the inner circumferential surface side of the one-face side electrode 5*a* of the respective piezoelectric devices 5, . . . , 5 as shown in FIG. 16. Specifically, the backing member 3 is formed such that alumina powder is disposed in a range 51 shown-in a chain line from the inner circumferential surface side of the one-face side electrode 5*a* in high density, as headed to the center direction, the density of the alumina powder is gradually reduced, and a so-called skimming layer 52 made up of a epoxy resin alone is formed from the chain double-dashed line to the center side.

Thus, the cylindrical unit is formed and turned at a predetermined speed. A predetermined amount of a liquid resin member in which filler serving as a backing member is mixed is supplied. Then, the resin member supplied with the cylindrical unit in a turning state is hardened and filler is evenly distributed from the inner circumferential surface side of the respective piezoelectric devices to the center direction, a backing member having uniform thickness is formed, thereby yielding a radial-array ultrasonic transducer. Thus, the ultrasonic images of excellent radial images can be obtained by performing ultrasonic observation using the radial-array ultrasonic transducer wherein the backing member having uniform acoustic properties as to each piezoelectric device is disposed.

Note that the backing member can be prevented from occurrence of residual stress in a sure manner by disposing the backing member without using an adhesive agent on the one-face side electrode side of the piezoelectric devices.

Also, an accommodation space for accommodating the contents making up an ultrasonic endoscope may be expanded by removing the skimming layer of the backing member, and forming the inner diameter of the inner hole of an ultrasonic transducer to be a large diameter.

Also, with the present embodiment, the processes for forming the radial-array ultrasonic transducer have been described, but though not shown in the drawing, a convex-array ultrasonic transducer can be obtained, for example, by cutting at a predetermined angle such as cutting along the diameter in the longitudinal direction to change the cross-sectional shape to a generally half-round shape or the like.

Figure 17A:
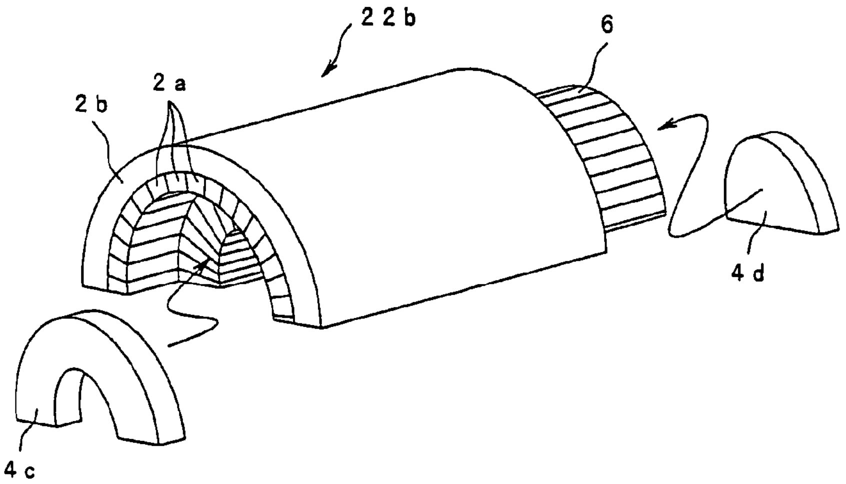
FIG. 17A is a diagram illustrating a shape-formative member and a second layered member for forming a convex-array transducer unit.
Figure 17B:
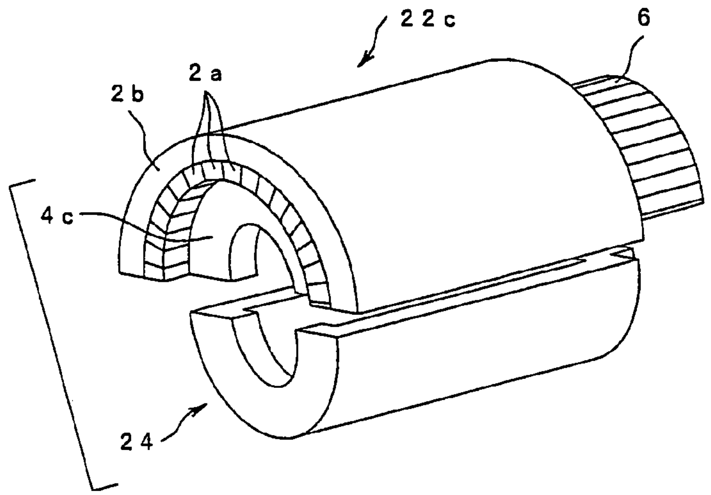
FIG. 17B is a diagram for describing another method for forming a convex-array ultrasonic transducer.

Further, as shown in FIG. 17A, for example, a convex-array transducer unit 22*c* is formed by fixing shape-formative members 4*c* and 4*d* provided with a recessed portion for inserting a supply pipe formed in a half-round shape or the like to the first acoustic matching layer 2*a* of the second layered member 22*b* having the piezoelectric devices 5, . . . , 5 divided into a predetermined number in a predetermined shape, as with the above description. Subsequently, as shown in FIG. 17B, the convex-array transducer unit 22*c* is disposed integrally with a dummy member 24 making 22*c* a generally the same shape as the cylindrical unit 23. Subsequently, in this state, the liquid resin 33 is supplied, and also is hardened to form a backing member, as with the above description. Subsequently, a convex-array ultrasonic transducer can be obtained by removing unnecessary portions of the dummy member 24 and the backing member, as with the above description.

Figure 17C:
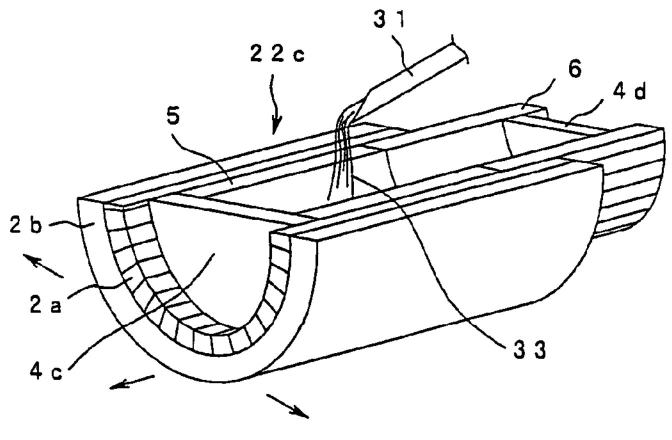
FIG. 17C is a diagram for describing another method for forming a convex-array ultrasonic transducer.

Also, as shown in FIG. 17C, the convex-array transducer unit 22*c* is disposed on an unshown tool. Subsequently, a convex-array ultrasonic transducer wherein the backing member having uniform acoustic properties as to each piezoelectric device is disposed can be obtained by supplying a predetermined amount of the liquid resin 33 in that state while oscillating the convex-array transducer unit 22*c* in a predetermined state, and also maintaining the oscillating state for a predetermined period to harden the liquid resin 33, as with the above embodiment.

Thus, an ultrasonic transducer in a predetermined shape can be formed with high precision by fixing and disposing a shape-formative member made up of a hard material formed in a predetermined shape on the first acoustic matching layer made up of a hard material making up the acoustic matching layer protruding from the piezoelectric devices, and also an ultrasonic transducer wherein occurrence of malfunction due to residual stress is prevented in a sure manner can be formed.

Thus, the piezoelectric devices formed by dividing the piezoelectric ceramic into a plurality of piezoelectric devices are arrayed with high precision, and high-quality ultrasonic observation images can be obtained for a long period in a stable manner.

Note that the present invention is not restricted to the above embodiment alone; rather, various modifications can be made without departing from the spirit or scope of the present invention. For example, with the present embodiment, the substrate 6 and the piezoelectric device 5 are disposed in parallel, and are electrically connected by the electroconductive member, but the present invention is not restricted to this, for example, the substrate may be positioned on the inside or the side face of the backing member, the frame and the substrate may be united, or the substrate and the piezoelectric device may be connected with a metal fine wire or the like.

What is claimed is:

1. An ultrasonic transducer comprising:

an acoustic matching layer formed by layering at least a first acoustic matching layer made up of a hard material, and a second acoustic matching layer made up of a soft material;

a piezoelectric member having a length dimension shorter than the acoustic matching layer, the piezoelectric member being fixed and disposed at a predetermined position on a surface of the first acoustic matching layer, and divided into a plurality of piezoelectric devices in the disposed state; and a transducer shape-formative member made up of a hard material being fixed and disposed on a portion of the surface of the first acoustic matching layer side making up the acoustic matching layer on which the piezoelectric devices are disposed, the portion protruding beyond the piezoelectric devices, wherein the piezoelectric devices are disposed on an inner circumferential surface side of the acoustic matching layer and arrayed in a predetermined shape.

2. An ultrasonic transducer according to claim 1, wherein the piezoelectric devices are formed by providing dividing grooves in a predetermine interval to the second acoustic matching layer passing through the first acoustic matching layer from the surface of a piezoelectric member fixed and disposed on the first acoustic matching layer.

3. An ultrasonic transducer according to claim 1, wherein the transducer shape-formative member is a circular shape.

4. An ultrasonic transducer according to claim 1, wherein the transducer shape-formative member is a partially cylindrical shape.

5. An ultrasonic transducer according to claim 1, wherein the transducer shape-formative member is a flat plate shape.

6. An ultrasonic transducer comprising:

an acoustic matching layer including a layer made up of a hard material;

a piezoelectric member, fixed and disposed in a positional relation wherein a part of the acoustic matching layer protrudes at a predetermined position of the hard layer, the piezoelectric member having a first face side electrode and a second face side electrode disposed on a first and second flat surface portions, the piezoelectric member being divided into a plurality of piezoelectric devices in the disposed state; and a transducer shape-formative member made up of a hard material being fixed and disposed on a portion of the surface of the acoustic matching layer on which the piezoelectric devices are disposed, the portion protruding beyond the piezoelectric devices, wherein piezoelectric devices are disposed on an inner circumferential surface side of the acoustic matching layer and arrayed in a predetermined shape, and wherein a band-shaped electroconductive member in a predetermined width facing the electrode provided on the flat face portion of the piezoelectric member is provided at a predetermined position on an edge portion side of the acoustic matching layer in parallel with the piezoelectric member, and an electroconductive portion is disposed on the transducer shape-formative member so as to face the electroconductive member extended from the piezoelectric member.

7. An ultrasonic transducer according to claim 6, wherein at least one of electrical conductivity between the electrodes provided on the flat surface portions of the piezoelectric member and the band-shaped electroconductive member provided on the acoustic matching layer, and electrical conductivity between this electroconductive member and the electroconductive portion of the transducer shape-formative member, is performed by contact.

8. An ultrasonic transducer according to claim 6, wherein at least one of electrical conductivity between the electrodes provided on the flat surface portions of the piezoelectric member and the band-shaped electroconductive member provided on the acoustic matching layer, and electrical conductivity between this electroconductive member and the electroconductive portion of the transducer shape-formative member, is performed through an electroconductive member.

9. An ultrasonic transducer comprising:

an acoustic matching layer including at least a layer made up of a hard material;

a piezoelectric member, fixed and disposed in a positional relation wherein part of the acoustic matching layer protrudes at a predetermined position of the hard layer, the piezoelectric member having a first face side electrode and a second face side electrode disposed on a first and second flat surface portions, the piezoelectric member being divided into a plurality of piezoelectric devices in the disposed state; and a transducer shape-formative member made up of a hard material being fixed and disposed on a portion of the surface of the acoustic matching layer on which the piezoelectric devices are disposed, the portion protruding beyond the piezoelectric devices, wherein the piezoelectric devices are disposed on an inner circumferential surface side of the acoustic matching layer and arrayed in a predetermined shape, and wherein a band-shaped electroconductive member in a predetermined width facing the electrode provided on the flat face portion of the piezoelectric member is provided at a predetermined position on an edge portion side of the acoustic matching layer in-parallel with the piezoelectric member, and an electroconductive portion is disposed on the transducer shape-formative member so as to face the electroconductive member extended from the piezoelectric member.

10. An ultrasonic transducer according to claim 9, wherein at least one of electrical conductivity between the electrodes provided on the flat surface portions of the piezoelectric member and the band-shaped electroconductive member provided on the acoustic matching layer, and electrical conductivity between this electroconductive member and the electroconductive portion of the transducer shape-formative member, is performed by contact.

11. An ultrasonic transducer according to claim 9, wherein at least one of electrical conductivity between the electrodes provided on the flat surface portions of the piezoelectric member and the band-shaped electroconductive member provided on the acoustic matching layer, and electrical conductivity between this electroconductive member and the electroconductive portion of the transducer shape-formative member is performed through an electroconductive member.

12. An ultrasonic transducer according to claim 11, wherein the electroconductive member is a brazing metal or solder, an electroconductive adhesive agent, or a conductive film.

13. An ultrasonic transducer according to claim 1, wherein the ultrasonic transducer is an array type.

14. An ultrasonic transducer according to claim 6, wherein the ultrasonic transducer is an array type.

15. An ultrasonic transducer according to claim 9, wherein the ultrasonic transducer is an array type.

* * * * *